United States Patent
Hess et al.

(10) Patent No.: US 10,564,209 B2
(45) Date of Patent: Feb. 18, 2020

(54) ALTERNATING CURRENT COUPLED OPEN CIRCUIT DETECTION FOR LOW LEVEL DIRECT CURRENT ANALOG INTERFACES

(71) Applicant: HAMILTON SUNDSTRAND CORPORATION, Charlotte, NC (US)

(72) Inventors: Gary L. Hess, Somers, CT (US); Eric Petersen, Phoenix, AZ (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 385 days.

(21) Appl. No.: 15/482,157

(22) Filed: Apr. 7, 2017

(65) Prior Publication Data
US 2018/0292444 A1    Oct. 11, 2018

(51) Int. Cl.
| G01R 31/02 | (2006.01) |
| G01R 31/28 | (2006.01) |
| G01R 35/00 | (2006.01) |

(52) U.S. Cl.
CPC ....... *G01R 31/026* (2013.01); *G01R 31/2884* (2013.01); *G01R 35/005* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS

| 4,740,756 A | 4/1988 | Graham et al. |
| 5,977,774 A | 11/1999 | Noble et al. |
| 7,629,796 B2 | 12/2009 | Eun et al. |
| 7,841,771 B2 | 11/2010 | Perotti et al. |
| 9,190,966 B2 | 11/2015 | Krohn |
| 2009/0049928 A1 | 2/2009 | Hays et al. |
| 2012/0013345 A1* | 1/2012 | Carter ............. G01D 3/08 324/538 |
| 2012/0105077 A1* | 5/2012 | Geneste ........... G01D 18/00 324/604 |

FOREIGN PATENT DOCUMENTS

| EP | 2752645 A2 | 7/2014 |
| WO | 2005100922 A2 | 10/2005 |

OTHER PUBLICATIONS

European Search Report for Application No. 18166349.3-1022; dated Aug. 9, 2018; 7 pgs.

* cited by examiner

*Primary Examiner* — Tung X Nguyen
(74) *Attorney, Agent, or Firm* — Cantor Colburn LLP

(57) ABSTRACT

Embodiments herein relate to a system and method for detecting an open circuit in a sensor measurement system. The system including a sensor having a direct current (DC) output, operably connected to a wiring harness and configured to transmit a sensor signal, and a controller, the controller operably connected to the wiring harness. The controller is configured execute a method including receiving a sensor signal from the sensor, AC coupling an AC signal with the sensor signal to form a coupled signal, measuring the coupled signal, determining if an open circuit is present based on the coupled signal and characterizing the sensor as failed if the open circuit is detected.

7 Claims, 6 Drawing Sheets

ALTERNATING CURRENT COUPLED OPEN CIRCUIT DETECTION FOR LOW LEVEL DIRECT CURRENT ANALOG INTERFACES

TECHNICAL FIELD

The present disclosure relates to a monitoring device for low level direct current (DC) analog sensors and to a corresponding method for monitoring low level DC analog sensors, particularly in an aircraft application.

BACKGROUND

Modern aircraft have a plurality of control surfaces, systems, actuators, torques, temperatures, and the like which need to be monitored to ensure proper operation of the aircraft In order to be able to monitor the various aircraft parameters, sensors are used on the individual control surfaces, actuators, and engines to detect the various parameters. The values detected by the sensors can subsequently be employed for instrumentation, used to generate control commands, and for various diagnostics. With diagnostic applications, the values detected by the sensors may be compared with predetermined values for a given parameter under selected conditions and a malfunction can be identified in the event a deviation is detected by the respective sensor from the predetermined values.

A variety of sensors may be employed depending on the application. Rotary or Linear Variable Differential Transformer sensors (RVDT or LVDT sensors), synchros and resolvers are conventionally used as sensors in aircraft because they are very robust with respect to external disturbances and have simple construction. However, in other applications potentiometers and some low-level sensors are also commonly employed. Unfortunately, such sensors are commonly not as robust, and may be more susceptible to external disturbances and, because of their low signal levels, offsets and biases in signal processing circuitry.

When sensors are used to detect various aircraft parameters, the sensors used must typically be monitored to ensure error free operation. Failures of sensors, and/or the wiring harness, or interfaces to sensors impact system reliability and result in a need for redundancy and overdesign to ensure operation. It is also desirable to ensure that potential failures are not only detectable, but also, preferably relegated to lesser importance and minimized impact on system reliability. Therefore, it is desirable to have a simplified sensor interface where potential failures such as open circuits in the sensor or wiring are detectable or mitigated, or both, such that their impact is not significant.

SUMMARY

According to one embodiment of the invention, described herein is a system and method for detecting an open circuit in a sensor measurement system. The system including a sensor having a direct current (DC) output, operably connected to a wiring harness and configured to transmit a sensor signal, and a controller, the controller operably connected to the wiring harness. The controller is configured to execute a method including receiving a sensor signal from the sensor, AC coupling an AC signal with the sensor signal, measuring the sensor signal including the AC coupled signal, determining if an open circuit is present based on the sensor signal including the AC coupled signal and characterizing the sensor as failed if the open circuit is detected.

In addition to one or more of the features described above, or as an alternative, further embodiments may include that the sensor is a low-level DC device exhibiting an output voltage less than about 1 VDC.

In addition to one or more of the features described above, or as an alternative, further embodiments may include that the sensor includes at least one of a strain gauge, a bimetallic thermocouple, and a resistive temperature device.

In addition to one or more of the features described above, or as an alternative, further embodiments may include that the coupling is at least one of capacitive, inductive and magnetic.

In addition to one or more of the features described above, or as an alternative, further embodiments may include the controller generating an excitation signal and transmitting it to the sensor.

In addition to one or more of the features described above, or as an alternative, further embodiments may include a second sensor operably connected to the wiring harness and operably connected to the controller.

In addition to one or more of the features described above, or as an alternative, further embodiments may include that the controller is configured to execute a method including receiving a second sensor signal from the second sensor, AC coupling an AC signal with the second sensor signal to form a second coupled signal, and measuring the second coupled signal. The method may also include determining if an open circuit is present based on the second coupled signal, and characterizing the second sensor as failed if the open circuit is detected.

In addition to one or more of the features described above, or as an alternative, further embodiments may include that the controller includes a data acquisition system.

In addition to one or more of the features described above, or as an alternative, further embodiments may include the controller configured to execute a built in test function.

In addition to one or more of the features described above, or as an alternative, further embodiments may include that the built in test function includes a step of the controller applying a known stimulus as the primary excitation to the sensor and monitoring a response.

In addition to one or more of the features described above, or as an alternative, further embodiments may include that the built in test function identifies at least one of a short circuit and an open circuit.

Also described herein in an embodiment is a method of detecting an open circuit in a sensor system with a sensor operably connected to a controller via a wiring harness. The controller configured to perform a process including receiving a sensor signal from the sensor, AC coupling an AC signal with the sensor signal to form a coupled signal, and measuring the coupled signal. The process also includes determining if an open circuit is present based on the coupled signal, and characterizing the sensor as failed if the open circuit is detected.

In addition to one or more of the features described above, or as an alternative, further embodiments may include that the sensor is one of: a strain gauge, a bimetallic thermocouple, and a resistive temperature device.

In addition to one or more of the features described above, or as an alternative, further embodiments may include that the coupling is at least one of capacitive, inductive and magnetic.

In addition to one or more of the features described above, or as an alternative, further embodiments may include generating an excitation signal and transmitting it to the sensor.

In addition to one or more of the features described above, or as an alternative, further embodiments may include operably connecting a second sensor to the wiring harness and the controller.

In addition to one or more of the features described above, or as an alternative, further embodiments may include the controller executes a method including receiving a second sensor signal from the second sensor, AC coupling an AC signal with the second sensor signal to form a second coupled signal, and measuring the second coupled signal. The method also includes determining if an open circuit is present based on the second coupled signal and characterizing the second sensor as failed if the open circuit is detected.

In addition to one or more of the features described above, or as an alternative, further embodiments may include executing a built in test function with the controller.

In addition to one or more of the features described above, or as an alternative, further embodiments may include that the built in test function includes applying a known stimulus as the primary excitation to the sensor and monitoring a response.

In addition to one or more of the features described above, or as an alternative, further embodiments may include that the built in test function includes identifying at least one of a short circuit and an open circuit.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
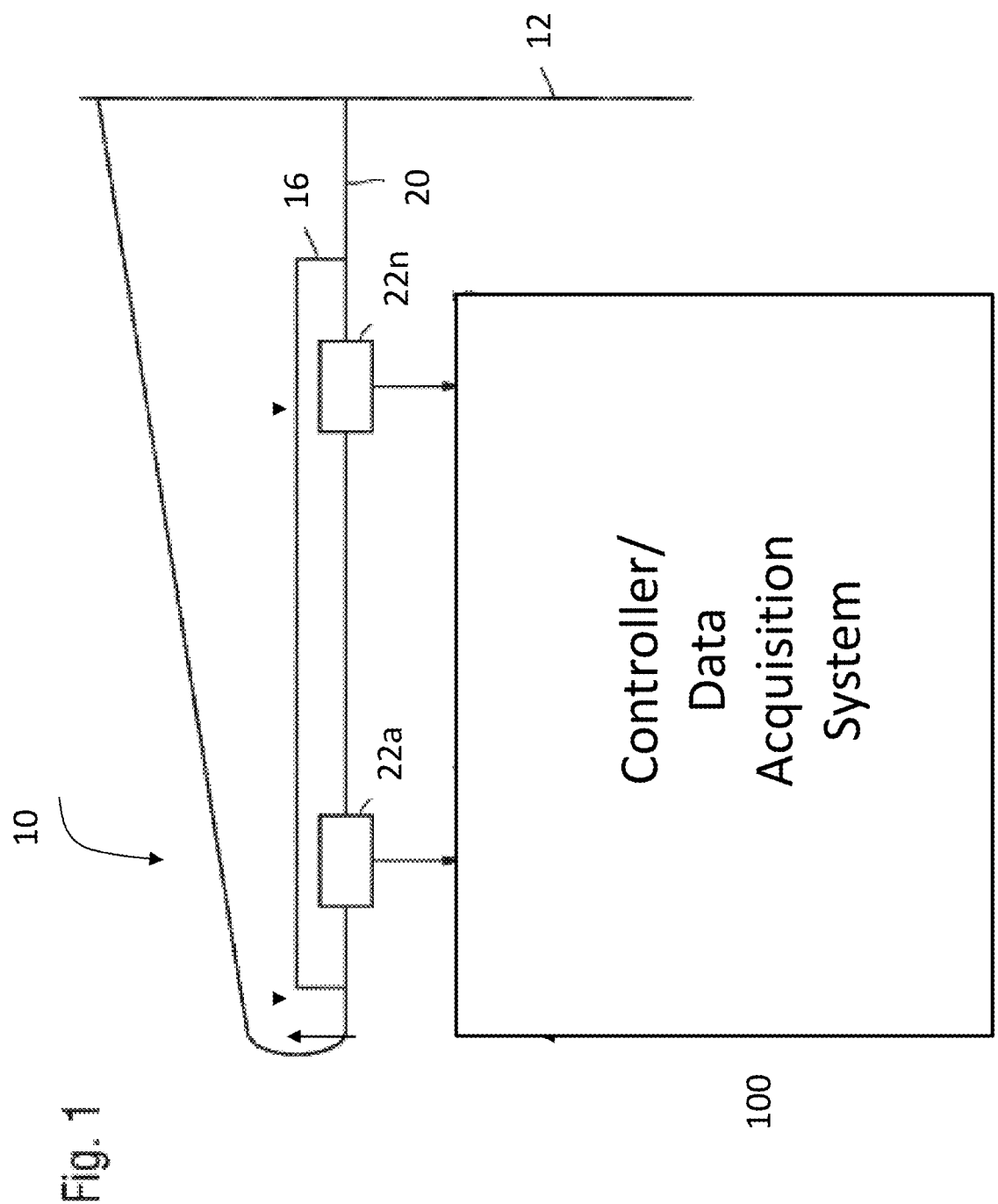
FIG. 1 depicts a simplified diagram of an aircraft data acquisition system in accordance with an embodiment.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended. The following description is merely illustrative in nature and is not intended to limit the present disclosure, its application or uses. It should be understood that throughout the drawings, corresponding reference numerals indicate like or corresponding parts and features. As used herein, the term controller refers to processing circuitry that may include an application specific integrated circuit (ASIC), an electronic circuit, an electronic processor (shared, dedicated, or group) and memory that executes one or more software or firmware programs, a combinational logic circuit, and/or other suitable interfaces and components that provide the described functionality.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

In general, embodiments herein relate generally to a sensor interface design where risk of selected faults are mitigated such that they do not impact system operation and overall reliability. Turning now to FIG. 1, a simplified diagram of a control or data acquisition system 10 on an aircraft 12 (partially shown) is depicted. The control system 10 includes, but is not limited to a control surface 16 depicted in this instance, on an aircraft wing 20. The control system 10 includes one or more sensors 22a, 22b . . . 22n configured to measure any variety of aircraft parameters. For example, in this instance, a displacement or speed of the control surface 16, other parameters include, but are not limited to, temperatures, pressures, strains, and the like. The sensors 22a, 22b . . . 22n could be any configured to measure the aircraft parameter including RVDTs, LVDTs, potentiometers, thermocouples, bimetallic thermocouples, strain gauges, and the like. However for the embodiments described herein, the focus is directed more particularly to low level sensors 22a, 22b . . . 22n such as thermocouples, strain gauges, resistive temperature devices (RTD) and the like. Such sensors typically exhibit a low level output generally on the order of millivolts. These sensors present unique challenges for signal interfaces and processing, particularly in an electromagnetically noisy environment such as on an aircraft 12. While the following descriptions of the embodiments will be made with respect to application with a low-level sensor 22a, 22b . . . 22n such as thermocouple temperature sensor 22a, 22b . . . 22n, it will be appreciated that the described embodiments may readily be applied to other sensors and particularly low level sensors 22a, 22b . . . 22n.

Figure 2:
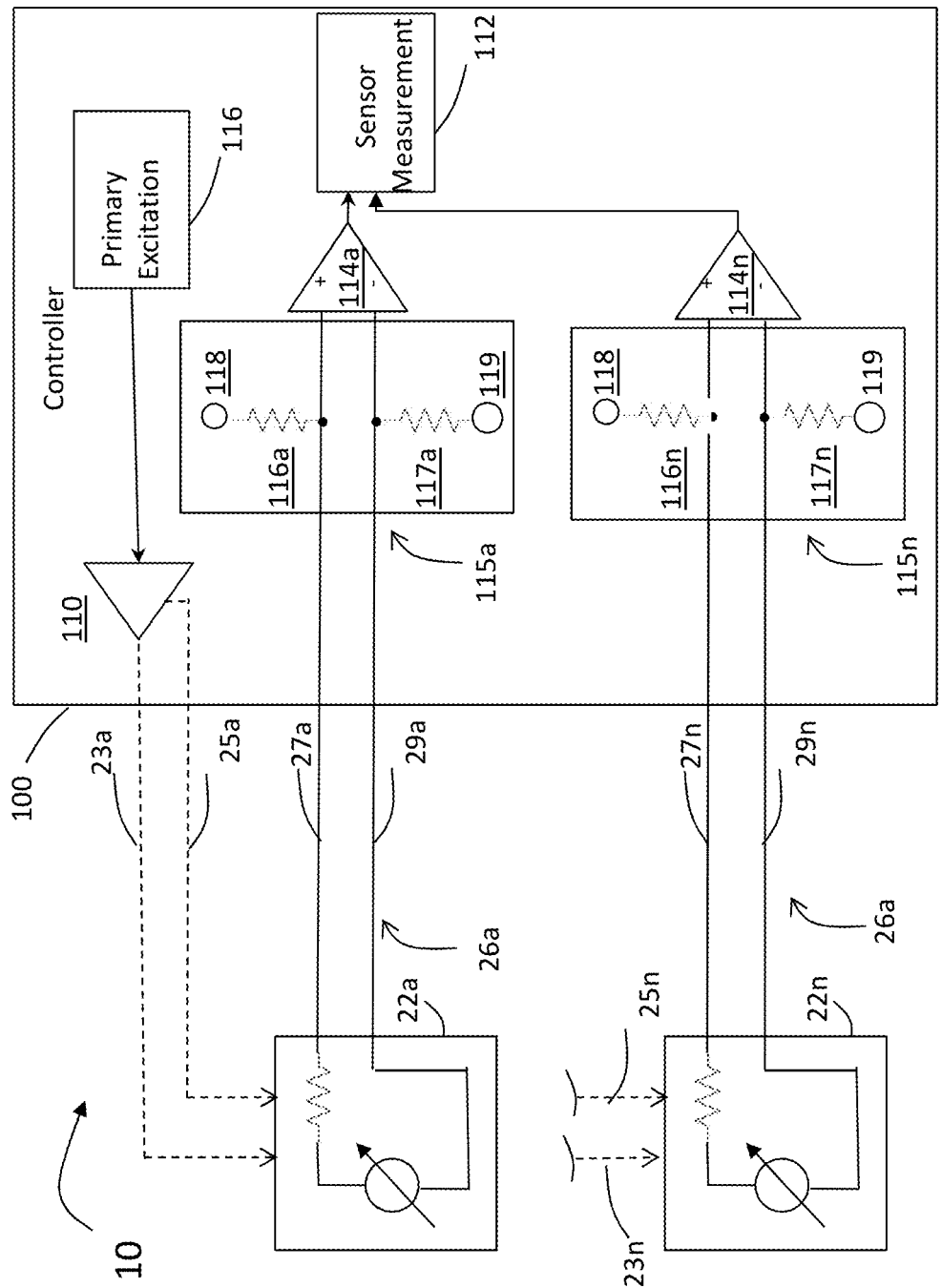
FIG. 2 depicts a simplified schematic of conventional controller and sensor interfaces for open circuit detection.

Referring now to FIG. 2 as well, where a simplified diagram of a conventional low level sensor interface in the controller 100 is depicted. When a sensor 22a-22n is employed in application on the aircraft 12, the controller 100 of data acquisition system 10, hereinafter just referred to as controller 100 typically provides a precise direct current (DC) excitation via amplifier 110 and precisely reads the DC output voltage level signal shown generally as 26a-26n of each sensor 22a-22n via lines 27a-27n and 29a-29n of the wiring harness with amplifier 114a-114n and Sensor Measurement block 112. In some embodiments, providing the precise DC excitation is not readily possible or required and only the DC output voltage level from the sensors 22a-22n is monitored. In some embodiments the amplifier 114a-114n may not be utilized, in others it may be a differential amplifier. For these systems, it is commonly desirable to try to detect any functional failures of the sensor 22a-22n and any associated wiring harness 27a-27n and 29a-29n. Such potential failures include a variety of failure modes such as open circuits and short circuits of the sensor and open circuits and short circuits of any associated wiring.

Advantageously, many of these potential faults exhibit relatively straight forward symptoms and facilitate readily available methods of detection. For open circuit detection for example, a conventional approach utilized is to employ an offset circuit shown generally as 115a-115n with large high value pull up 116a-116n and pull down resistors 117a-117n to the positive and negative DC excitation 118 and 119 respectively. Unfortunately, with respect to low level sensor signals the conventional approach of an off scale drive introduces potential errors. For example, a conventional off scale driver utilizing precision components, in operation still introduces about a 1.65% error in the data. For high precision applications employing low level sensing this 1.65% error can be objectionable. In addition, the use of high value resistors 117a-117n can be imprecise and can lead to electromagnetic interference (EMI) susceptibility.

Figure 3A:
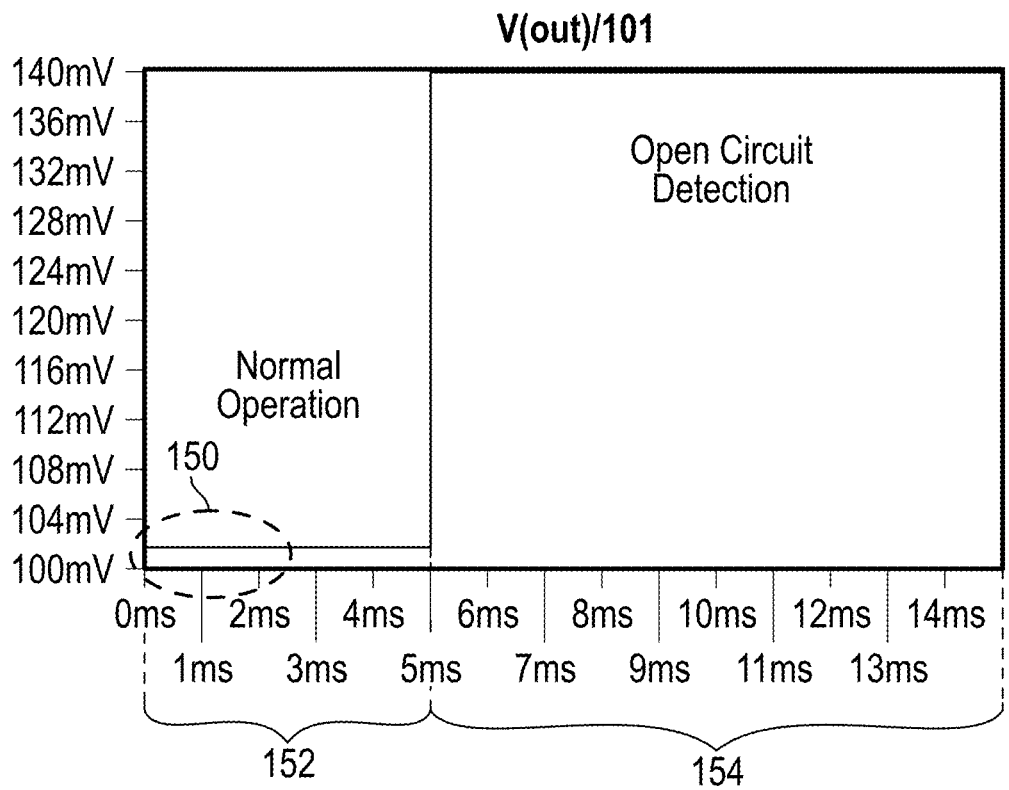
FIG. 3A is an image depicting the offset voltage error introduced with conventional open circuit detection schemes.
Figure 3B:
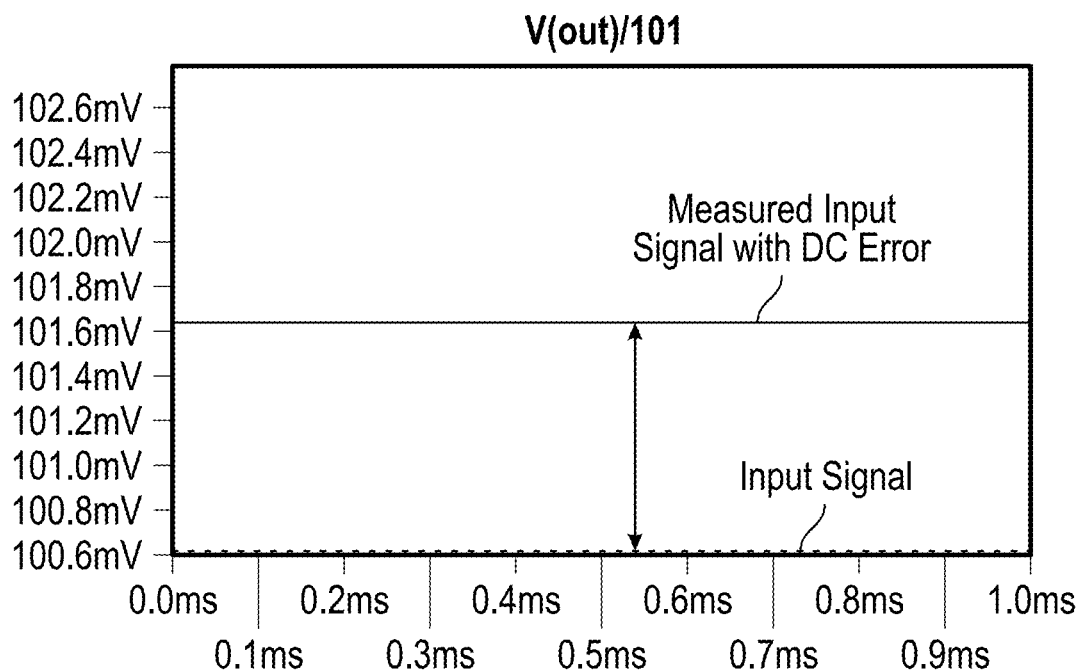
FIG. 3B is an expanded image depicting the offset voltage error introduced with conventional open circuit detection schemes.

As an example, FIGS. 3A and 3B depict the operation of the conventional offset circuit 115a-115n and impact of the error introduced by the circuit. In normal operation as depicted by reference numeral 152 a small offset as depicted by the circle identified by reference numeral 150. When an open circuit is encountered as depicted by reference numeral 154, the voltage contribution from the high value pull up 116a-116n and pull down resistors 117a-117n predominate and, as a result, the open circuit may be detected. In FIG. 3B is an expanded view of the offset error of about 1.65 my or 1.65% introduced by the offset circuit 115a-115n with a perfect input voltage of 100 mv.

Figure 4:
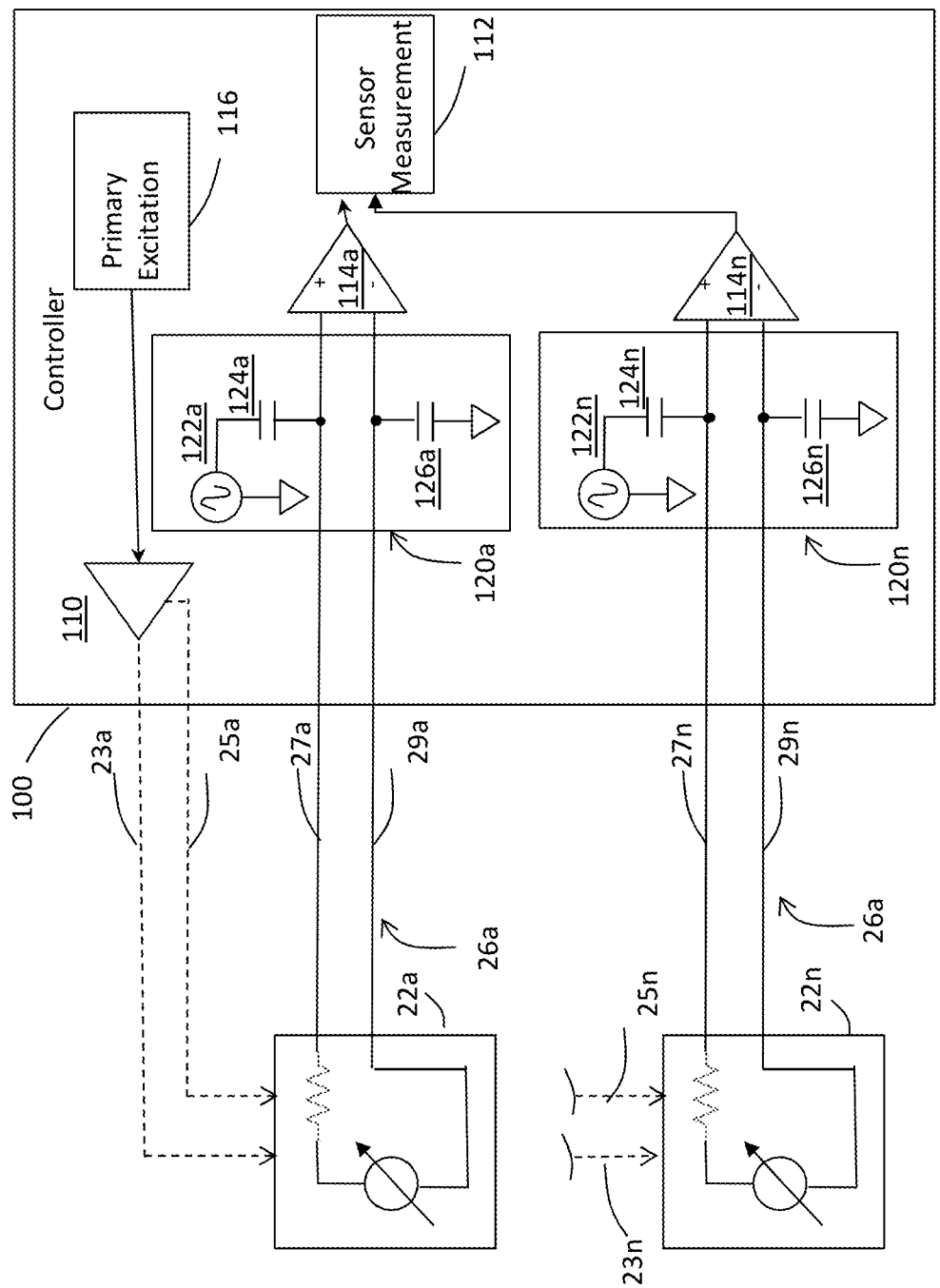
FIG. 4 depicts a simplified schematic of a controller and sensor interfaces for open circuit detection with AC coupling in accordance with an embodiment.

Referring now to FIG. 4 as well, where a simplified diagram of a low level sensor interface in accordance with an embodiment is depicted. In this embodiment, most of the elements are similar to that of FIG. 2 and like reference numerals are employed to identify like elements. Once again sensor 22a-22n provides a DC output voltage level signal 26a-26n of each sensor 22a-22n via lines 27a-27n and 29a-29n of the wiring harness with amplifier 114a-114n and Sensor Measurement block 112. In some embodiments, providing the precise DC excitation is not required and only the DC output voltage level from the sensors 22a-22n is monitored. In the described embodiments, to detect open circuits a different approach is employed than that described with respect to FIG. 2.

In an embodiment, an offset circuit shown generally as 120a-120n having a small signal, alternating current (AC) source 122a-122n, AC coupled to the sensor input signal 26a-26n via capacitors 124a-124n and 126a-126n. While the AC coupling has been described and shown as capacitive in an embodiment, it should be appreciated that any form of coupling an AC signal with the sensor signal 26a-26n is possible. For example with the appropriate circuit configuration, the AC coupling could be active, resistive, inductive, a transformer, and the like. Advantageously in the described embodiments, this approach eliminates the offset errors introduced with conventional pull up resistors as described with respect to FIG. 2. It will be apparent, though that a small AC signal will now be coupled with the sensor signals 26a-26n as they are applied to the amplifier 114a-114n. To address this concern the sensor measurement 112 executes a process to remove the coupled AC voltage from the sensor signal 26a-26n from the sensors 22a-22 in any of a variety of conventional techniques. For example, in one embodiment the controller 100 can significantly over sample the sensor signals 26a-26n with the AC coupled voltage to identify the AC portion of the sensor signal 26a-26n and then subtract it from the sensor signal 26a-26n to cancel its effect. Another technique that may be employed is just standard frequency based filtering to remove the coupled AC voltage. In many applications, such filtering may already be in place to address typical EMI susceptibility concerns.

Figure 5A:
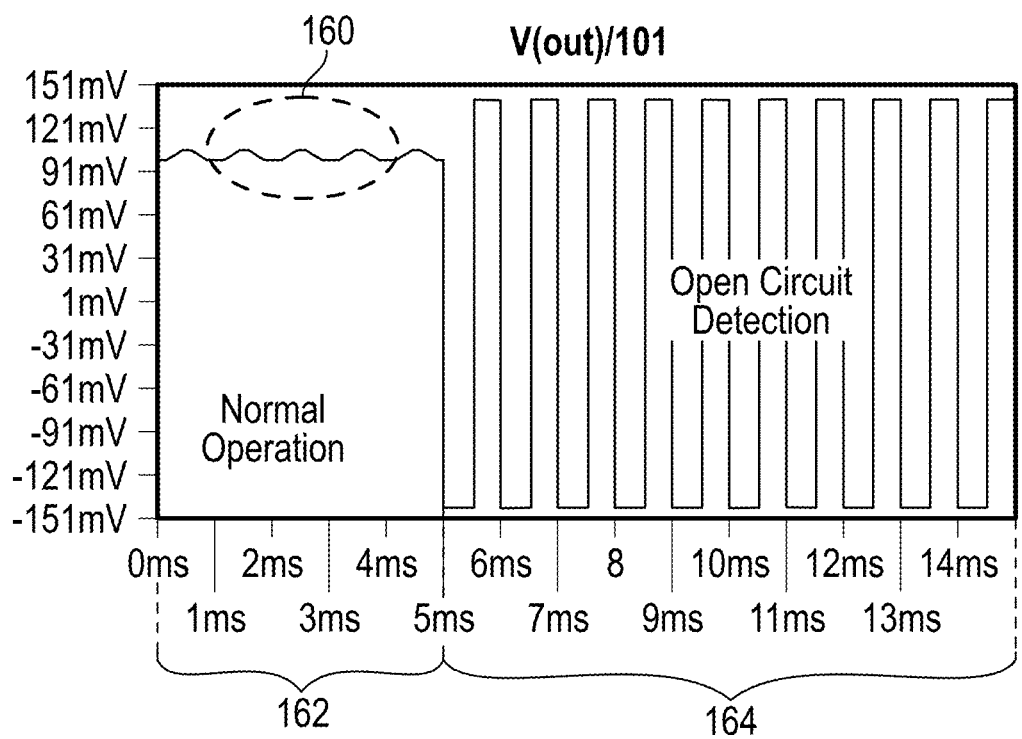
FIG. 5A is an image depicting the AC voltage coupled with the sensor signal during normal operation and when an open circuit is detected in accordance with an embodiment.
Figure 5B:
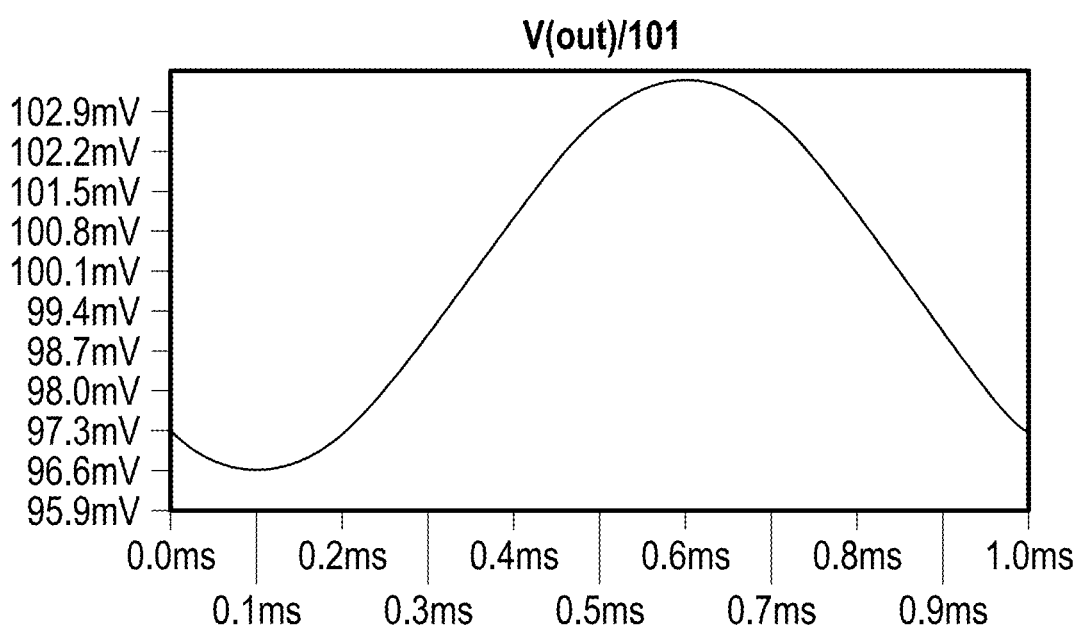
FIG. 5B is an expanded image depicting the AC voltage coupled with the sensor signal in accordance with an embodiment.

FIGS. 5A and 5B depict the operation of the offset circuit 120a-120n. In normal operation as denoted by reference numeral 162, the voltage amplitude of the sensor signal 26a-26n includes a small AC voltage superimposed on it as depicted by the circle identified by reference numeral 160. When an open circuit is encountered as depicted by reference numeral 164, there is no DC contribution from the sensor, and the coupling of the AC signal from the offset circuit 120a-120n predominates. In FIG. 5B is an expanded view of the sensor signal exhibiting the small AC voltage coupled on the order of abut 90 mV peak to peak onto the sensor signal 26a-26n when operating normally and no open circuit is detected.

It will be appreciated that while the embodiments herein have been described with respect to detecting/mitigating a open circuit, detection of other potential failure modes is also possible. For example, during power on or initiated built in test (PBIT, IBIT), when the sensors 22a-22n are not being used in application, an external wiring short may optionally be detected by applying known stimulus to the sensor 22a-22n primary high side on line 23a-23n and monitoring the voltage developed across the resistor 120 at the common point for the expected response. Moreover, during an PBIT, IBIT, test voltages and currents may be applied to the sensors to ensure no other failures are detected. For example, during PBIT, IBIT fault modes that may be detected by conventional BIT methods include, but may not be limited to: an open primary winding or primary excitation wire; an open in the secondary winding or secondary wire; a shorted primary winding or primary output wire shorted to primary return wire; and a shorted secondary winding or secondary output wire shorted to secondary return wire.

Figure 6:
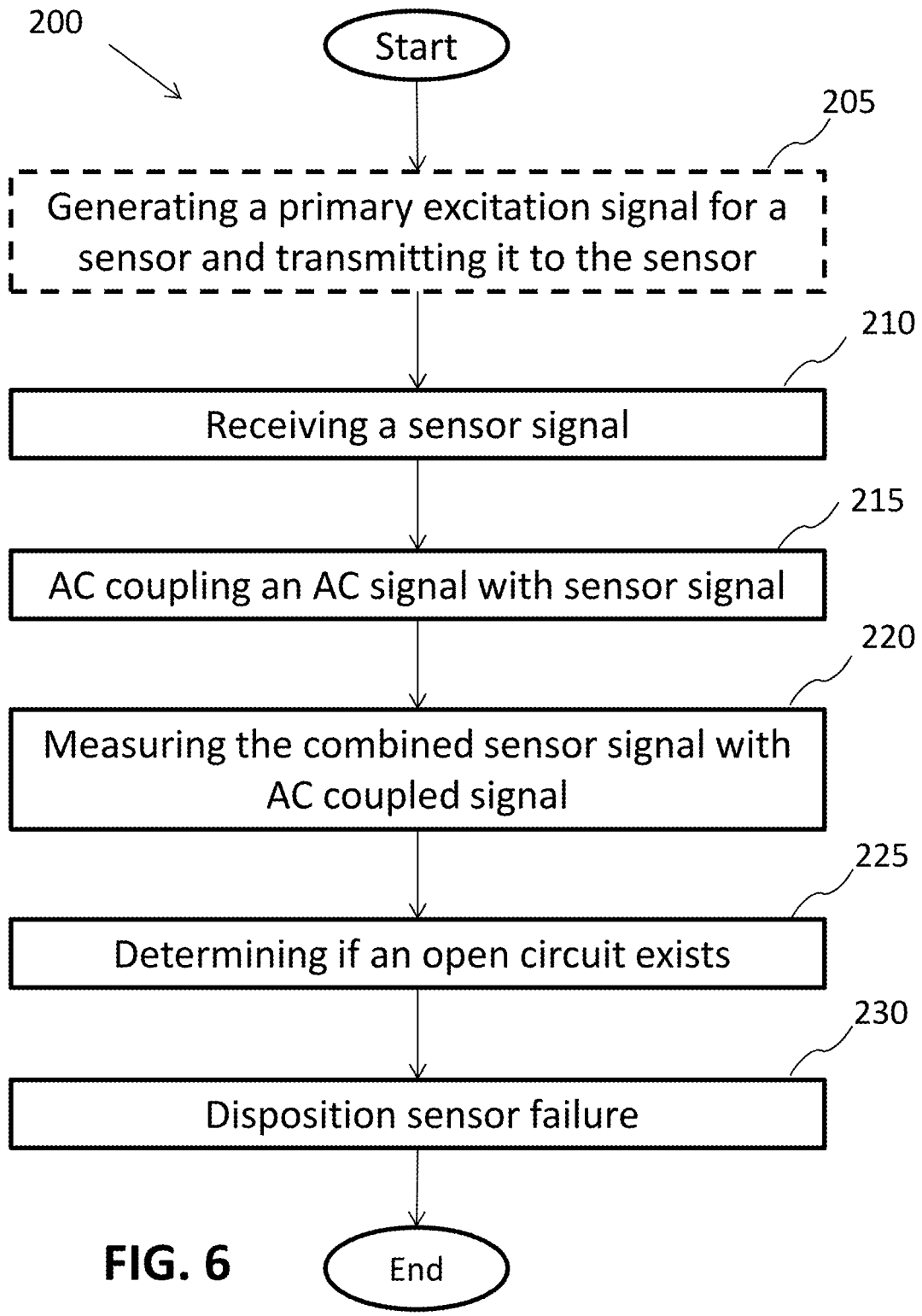
FIG. 6 is a flow chart depicting a method of detecting an open circuit in a low-level sensor signal in accordance with an embodiment.

Turing now to FIG. 6, a flowchart of the method 200 of open circuit detection and avoiding offset errors is depicted. The method includes an optional process step 205 of generating at the controller 100 a primary excitation signal for a sensor 22a-22n and transmitting it to the sensor 22a-22n respectively. As depicted at step 210, in accordance with the embodiments described herein a sensor signal 26a-26n is received at the controller 100. At process step 215, an AC signal is coupled with the sensor signals 26a-26n. This signal is then monitored and measured as depicted at process step 220. Based on the measured signal and the characteristics of the AC signal coupled with the sensor information, a determination is made if an open circuit is present. The open circuit could be in the sensor 22a-22n or in the wiring harness 27a-27n and 29a-29n carrying the sensor signal to the controller 100 as depicted at process step 225. The open circuit can be determined based of conventional techniques to characterize the AC signal measured. In one embodiment the sensor signal 26a-26n with the coupled AC voltage is significantly over sampled (i.e., sampled at a rate higher than the Nyquist frequency of the AC signal coupled with the sensor signal). Typical sampling rates are on the order of 10 times greater than the frequency of interest. In this manner the controller 100 can determine the presence of an open circuit in a low level sensor signal and yet avoid the undesirable offset produced by conventional techniques for open circuit. The controller 100 can then characterize, identify, and manage the failure as appropriate, such as annunciating the detected failure, attempting corrective action, and/or electing to ignore the sensor input exhibiting the open circuit as depicted at process step 230.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A system for detecting an open circuit in a sensor measurement system, the system comprising:
    a sensor having an input and a direct current (DC) output that produces a DC output signal;
    a wiring harness operably connected to the sensor and configured to transmit a sensor signal;
    a first alternating (AC) source;
    a first AC coupling capacitor connected between the first AC source and the DC output of the sensor that couples AC voltage from the AC source to the DC output to produce a coupled signal that is a combination of the DC output signal and the AC voltage;
    a controller, the controller operably connected to the wiring harness, the controller configured execute a method comprising:
    receiving the coupled signal from the sensor;
    measuring the coupled signal;
    determining if an open circuit is present based on the coupled signal; and
    characterizing at least one of the sensor and the wiring harness as failed if the open circuit is detected.

2. The system for detecting an open circuit in a sensor measurement system of claim 1, wherein the sensor is a low-level DC device exhibiting an output voltage less than about 1 VDC.

3. The system for detecting an open circuit in a sensor measurement system of claim 2, wherein the sensor includes at least one of a strain gauge, a bimetallic thermocouple, and a resistive temperature device.

4. The system for detecting an open circuit in a sensor measurement system of claim 1, further including the controller generating an excitation signal and transmitting it to the sensor.

5. The system for detecting an open circuit in a sensor measurement system of claim 1, wherein the controller includes a data acquisition system.

6. The system for detecting an open circuit in a sensor measurement system of claim 1, the controller is configured to execute a built in test function.

7. The system for detecting an open circuit in a sensor measurement system of claim 6, wherein the built in test function includes a step of the controller applying a known stimulus as the primary excitation to the sensor and monitoring a response.

* * * * *